(12) United States Patent
Ruiz et al.

(10) Patent No.: US 10,474,766 B2
(45) Date of Patent: Nov. 12, 2019

(54) PLAYBACK PROFILES FOR SIMULATING CONSTRUCTION SCHEDULES WITH THREE-DIMENSIONAL (3D) MODELS

(71) Applicant: Autodesk, Inc., San Rafael, CA (US)

(72) Inventors: Dirk Ruiz, Highland Park, NJ (US); Jess Wayne Judge, San Francisco, CA (US); Timothy James Vadney, Sr., Merrimack, NH (US)

(73) Assignee: AUTODESK, INC., San Rafael, CA (US)

( * ) Notice: Subject to any disclaimer, the term of this patent is extended or adjusted under 35 U.S.C. 154(b) by 877 days.

(21) Appl. No.: 14/842,663

(22) Filed: Sep. 1, 2015

(65) Prior Publication Data

US 2017/0061038 A1    Mar. 2, 2017

(51) Int. Cl.
*G06F 17/50* (2006.01)

(52) U.S. Cl.
CPC ................ *G06F 17/5004* (2013.01)

(58) Field of Classification Search
None
See application file for complete search history.

(56) References Cited

PUBLICATIONS

Tremblay, Thom. Autodesk Inventor 2010: no experience required. John Wiley & Sons, 2011. (Year: 2011).*

Toledo, M., Matabenitez, M., & Mora, M. (Jan. 2015). Improving planning in congested sites using 3D and 4D modelling: A case study of a pile-supported excavation project in Chile. In ISARC. Proceedings of the International Symposium on Automation and Robotics in Construction (vol. 32, p. 1). (Year: 2015).*

Chavada, R., Dawood, N., & Kassem, M. (2012). Construction workspace management: the development and application of a novel nD planning approach and tool. Journal of Information Technology in Construction. (Year: 2012).*

"Timeliner User Guide", Autodesk Navisworks 2014, Apr. 24, 2013. http://help.autodesk.com/view/NAV/2014/ENU/?contextId=dlg_TIMELINER_WND.

"Synchro PRO Basic Training 2015: 4D Scheduling & Construction Project Management Software", Synchro Software, 2015.

* cited by examiner

*Primary Examiner* — Bijan Mapar
(74) *Attorney, Agent, or Firm* — Gates & Cooper LLP

(57) ABSTRACT

A method, apparatus, system, and computer program product provide the ability to simulate a construction schedule. A first three-dimensional (3D) model and a schedule are acquired. The schedule includes activities for building the 3D model. Each of the activities is associated with model object(s) of the 3D model. A subset of the activities is selected based on properties of the activities. A first simulation appearance (of the model objects attached to the selected subset of activities) is defined. A second simulation appearance is defined for remaining/non-selected activities. The selected subset, the first simulation appearance, and the second simulation appearance are packaged into a playback profile that is capable of being applied to a second 3D model. A simulation of construction of the first 3D model (that is based on the playback profile) is played back.

20 Claims, 6 Drawing Sheets

PLAYBACK PROFILES FOR SIMULATING CONSTRUCTION SCHEDULES WITH THREE-DIMENSIONAL (3D) MODELS

BACKGROUND OF THE INVENTION

1. Field of the Invention

The present invention relates generally to construction schedules and simulations, and in particular, to a method, apparatus, system, and article of manufacture for simulating a construction schedule based on a playback profile.

2. Description of the Related Art

Creating construction schedules is difficult. Many variables must be taken into account: owner requirements, budget, site conditions, construction methods, subcontractor availability, labor regulations, weather conditions, productivity rates, equipment needed, materials needed, staging areas, safety considerations, and so on. To compound the problem, these variables interact in complex ways. A faster construction method might be more expensive. Dangerous site conditions might require improved safety measures. This means that schedulers need good analytic tools to help them visualize the schedule, so that they can see how this welter of interacting variables will impact the schedule.

One analytic tool that has been developed in the last few years is schedule playback, aka schedule simulation. The schedule's activities are connected to three-dimensional (3D) model objects. The schedule is then simulated (played back): the model objects are displayed in the order determined by the schedule. This helps users see how the building process will unfold over time. Unfortunately, schedule simulation has been of limited value. It can help communicate the schedule (particularly to owners) but it hasn't been of much help in building, editing and managing schedules.

The problem is that simple schedule simulation treats all model objects equally: the erection of structural steel is given no more special treatment than the installation of furniture. However, the equal treatment of all model objects is clearly not the case in real life: some aspects of the schedule (e.g. critical path activities) are more important than others.

To better understand the above problems, a description of prior art schedule simulation may be useful. Two exemplary prior art products perform schedule simulation: the AUTODESK NAVISWORKS TIMELINER simulation software and SYNCHRO SOFTWARE's SYNCHRO PRO scheduling and construction project management software.

The AUTODESK NAVISWORKS TIMELINER simulator software lets the user import a schedule and associate schedule activities with model objects. Then, the schedule can be played back. The default simulation is a simple buildout: objects are shown when the schedule mandates them. If desired, the user can create custom "Task Types" that specify different appearances (prebuild, build and postbuild) for schedule activities. Users have the ability to manually create custom task types and then manually select desired schedule activities and finally assign those task types to the schedule activities. Such a process might be fine for a small schedule, but is untenable for a schedule containing hundreds or thousands of activities (as many construction schedules do). Moreover, Task Type assignments for a model/schedule pair are completely specific to that pair: they cannot be ported to another model/schedule pair.

The SYNCHRO PRO software is largely similar to the TIMELINER simulator. It allows the user to associate selected model objects with schedule activities, and to then play back the schedule. It has a concept of "Use Profile" which is similar to the above described Task Type. As with the TIMELINER simulator, the Use Profile specifies prebuild, build and postbuild appearances for a schedule activity's model objects. By default, four Use Profiles are provided: one each for Install, Maintain, Remove and Temporary tasks. Further, the user may add and use custom Use Profiles. However, such an addition and use of custom profiles would be manual and arduous: each time model objects are assigned to a schedule activity, the custom Use Profile would have to be manually selected. Moreover, there seems to be no way to easily reuse a set of Use Profile assignments on a new model/schedule pair.

In view of the above, what is needed is an easy, straightforward way to select key schedule elements (like critical path activities), and to make the schedule simulation highlight those key elements. In this manner, the scheduler can study the impact of the multitude of interacting construction variables on specific aspects of the schedule. Thereafter, the scheduler can build a more complete understanding of the entire schedule.

SUMMARY OF THE INVENTION

Embodiments of the invention overcome the problems of the prior art and provide the ability to use "Playback Profiles". Users utilize scheduling logic to quickly and easily select desired schedule elements for special highlighting. The user can then associate static and dynamic appearances with those selected schedule elements. Thereafter, the user can package up that "profile" (i.e., the package of selected schedule elements and their associated appearances within a simulation) for later use. In that way, multiple profiles can be created quickly, and can be used on other model/schedule pairs. Embodiments of the invention may also provide a predefined set of Playback Profiles, each one highlighting a different aspect of a schedule (e.g., critical path, near critical, summary activities, etc.).

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

As described above, embodiments of the invention enable a user to define one or multiple playback profiles. Each playback profile may be defined easily by selecting schedule elements and highlighting model objects that are attached to those activities so that they stand out during schedule simulation. Playback Profiles are unique in allowing the user to leverage the model simulation to focus on the schedule itself, rather than on the specifics of the construction process (e.g. task type). Any aspect of the schedule that can be selected and associated with a schedule activity can become part of a Playback Profile. For example, the user might create a Playback Profile that colors activities by the number of participating subcontractors, thus providing a sort of "heat map" of work area occupancy. In essence, Playback Profiles let the user turn the model playback into a true schedule analysis tool.

Hardware Environment

Figure 1:
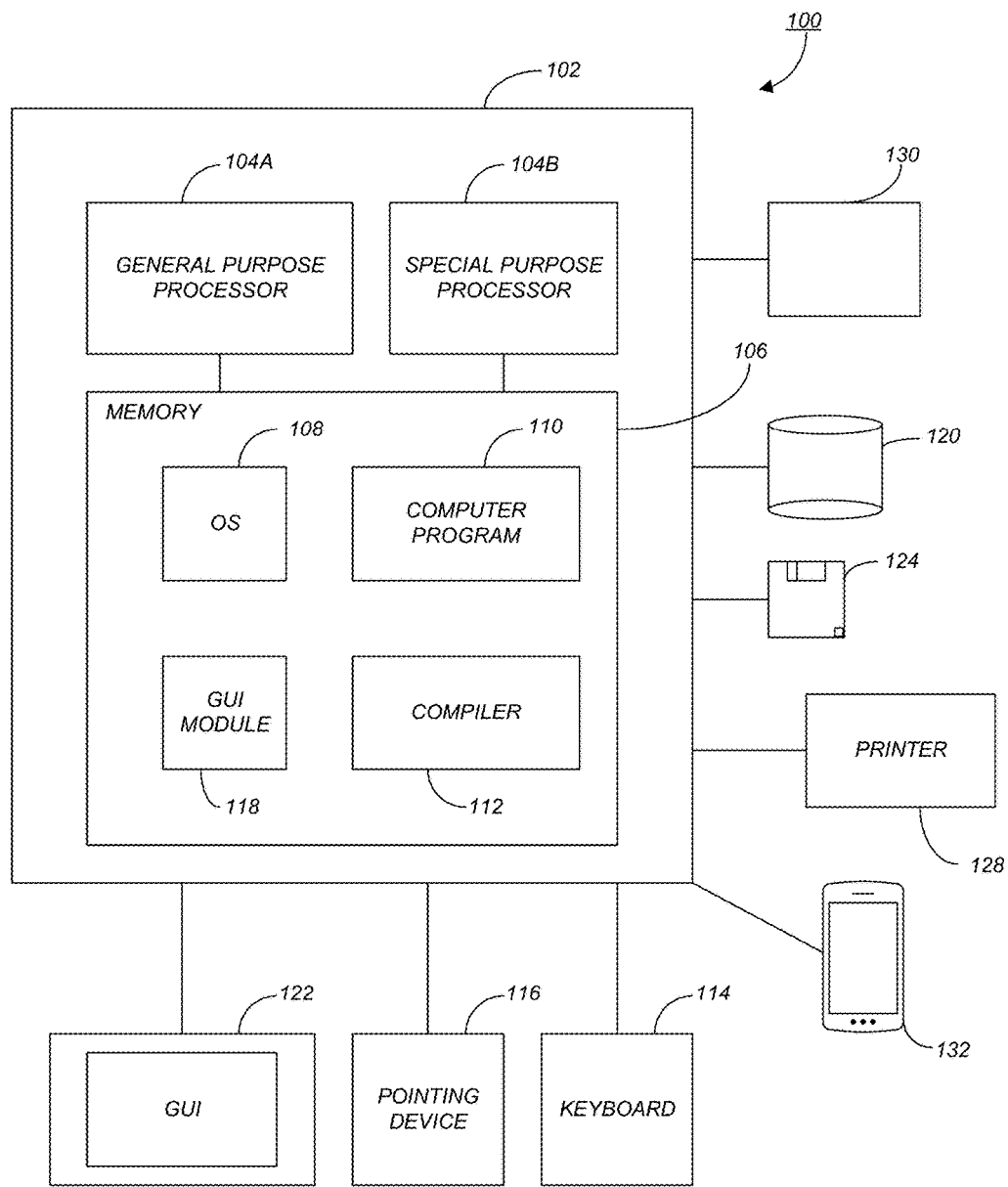
FIG. 1 is an exemplary hardware and software environment used to implement one or more embodiments of the invention.

FIG. 1 is an exemplary hardware and software environment 100 used to implement one or more embodiments of the invention. The hardware and software environment includes a computer 102 and may include peripherals. Computer 102 may be a user/client computer, server computer, or may be a database computer. The computer 102 comprises a general purpose hardware processor 104A and/or a special purpose hardware processor 104B (hereinafter alternatively collectively referred to as processor 104) and a memory 106, such as random access memory (RAM). The computer 102 may be coupled to, and/or integrated with, other devices, including input/output (I/O) devices such as a keyboard 114, a cursor control device 116 (e.g., a mouse, a pointing device, pen and tablet, touch screen, multi-touch device, etc.) and a printer 128. In one or more embodiments, computer 102 may be coupled to, or may comprise, a portable or media viewing/listening device 132 (e.g., an MP3 player, IPOD, NOOK, portable digital video player, cellular device, personal digital assistant, etc.). In yet another embodiment, the computer 102 may comprise a multi-touch device, mobile phone, gaming system, internet enabled television, television set top box, or other internet enabled device executing on various platforms and operating systems.

In one embodiment, the computer 102 operates by the general purpose processor 104A performing instructions defined by the computer program 110 under control of an operating system 108. The computer program 110 and/or the operating system 108 may be stored in the memory 106 and may interface with the user and/or other devices to accept input and commands and, based on such input and commands and the instructions defined by the computer program 110 and operating system 108, to provide output and results.

Output/results may be presented on the display 122 or provided to another device for presentation or further processing or action. In one embodiment, the display 122 comprises a liquid crystal display (LCD) having a plurality of separately addressable liquid crystals. Alternatively, the display 122 may comprise a light emitting diode (LED) display having clusters of red, green and blue diodes driven together to form full-color pixels. Each liquid crystal or pixel of the display 122 changes to an opaque or translucent state to form a part of the image on the display in response to the data or information generated by the processor 104 from the application of the instructions of the computer program 110 and/or operating system 108 to the input and commands. The image may be provided through a graphical user interface (GUI) module 118. Although the GUI module 118 is depicted as a separate module, the instructions performing the GUI functions can be resident or distributed in the operating system 108, the computer program 110, or implemented with special purpose memory and processors.

In one or more embodiments, the display 122 is integrated with/into the computer 102 and comprises a multi-touch device having a touch sensing surface (e.g., track pod or touch screen) with the ability to recognize the presence of two or more points of contact with the surface. Examples of multi-touch devices include mobile devices (e.g., IPHONE, NEXUS S, DROID devices, etc.), tablet computers (e.g., IPAD, HP TOUCHPAD), portable/handheld game/music/video player/console devices (e.g., IPOD TOUCH, MP3 players, NINTENDO 3DS, PLAYSTATION PORTABLE, etc.), touch tables, and walls (e.g., where an image is projected through acrylic and/or glass, and the image is then backlit with LEDs).

Some or all of the operations performed by the computer 102 according to the computer program 110 instructions may be implemented in a special purpose processor 104B. In this embodiment, the some or all of the computer program 110 instructions may be implemented via firmware instructions stored in a read only memory (ROM), a programmable read only memory (PROM) or flash memory within the special purpose processor 104B or in memory 106. The special purpose processor 104B may also be hardwired through circuit design to perform some or all of the operations to implement the present invention. Further, the special purpose processor 104B may be a hybrid processor, which includes dedicated circuitry for performing a subset of functions, and other circuits for performing more general functions such as responding to computer program 110 instructions. In one embodiment, the special purpose processor 104B is an application specific integrated circuit (ASIC).

The computer 102 may also implement a compiler 112 that allows an application or computer program 110 written in a programming language such as C, C++, Assembly, SQL, PYTHON, PROLOG, MATLAB, RUBY, RAILS, HASKELL, or other language to be translated into processor 104 readable code. Alternatively, the compiler 112 may be an interpreter that executes instructions/source code directly, translates source code into an intermediate representation that is executed, or that executes stored precompiled code. Such source code may be written in a variety of programming languages such as JAVA, JAVASCRIPT, PERL, BASIC, etc. After completion, the application or computer program 110 accesses and manipulates data accepted from I/O devices and stored in the memory 106 of the computer 102 using the relationships and logic that were generated using the compiler 112.

The computer 102 also optionally comprises an external communication device such as a modem, satellite link, Ethernet card, or other device for accepting input from, and providing output to, other computers 102.

In one embodiment, instructions implementing the operating system 108, the computer program 110, and the compiler 112 are tangibly embodied in a non-transitory computer-readable medium, e.g., data storage device 120, which could include one or more fixed or removable data storage devices, such as a zip drive, floppy disc drive 124, hard drive, CD-ROM drive, tape drive, etc. Further, the operating system 108 and the computer program 110 are comprised of computer program 110 instructions which, when accessed, read and executed by the computer 102, cause the computer 102 to perform the steps necessary to implement and/or use the present invention or to load the program of instructions into a memory 106, thus creating a special purpose data structure causing the computer 102 to operate as a specially programmed computer executing the method steps described herein. Computer program 110 and/or operating instructions may also be tangibly embodied in memory 106 and/or data communications devices 130, thereby making a computer program product or article of manufacture according to the invention. As such, the terms "article of manufacture," "program storage device," and "computer program product," as used herein, are intended to encompass a computer program accessible from any computer readable device or media.

Of course, those skilled in the art will recognize that any combination of the above components, or any number of different components, peripherals, and other devices, may be used with the computer 102.

Figure 2:
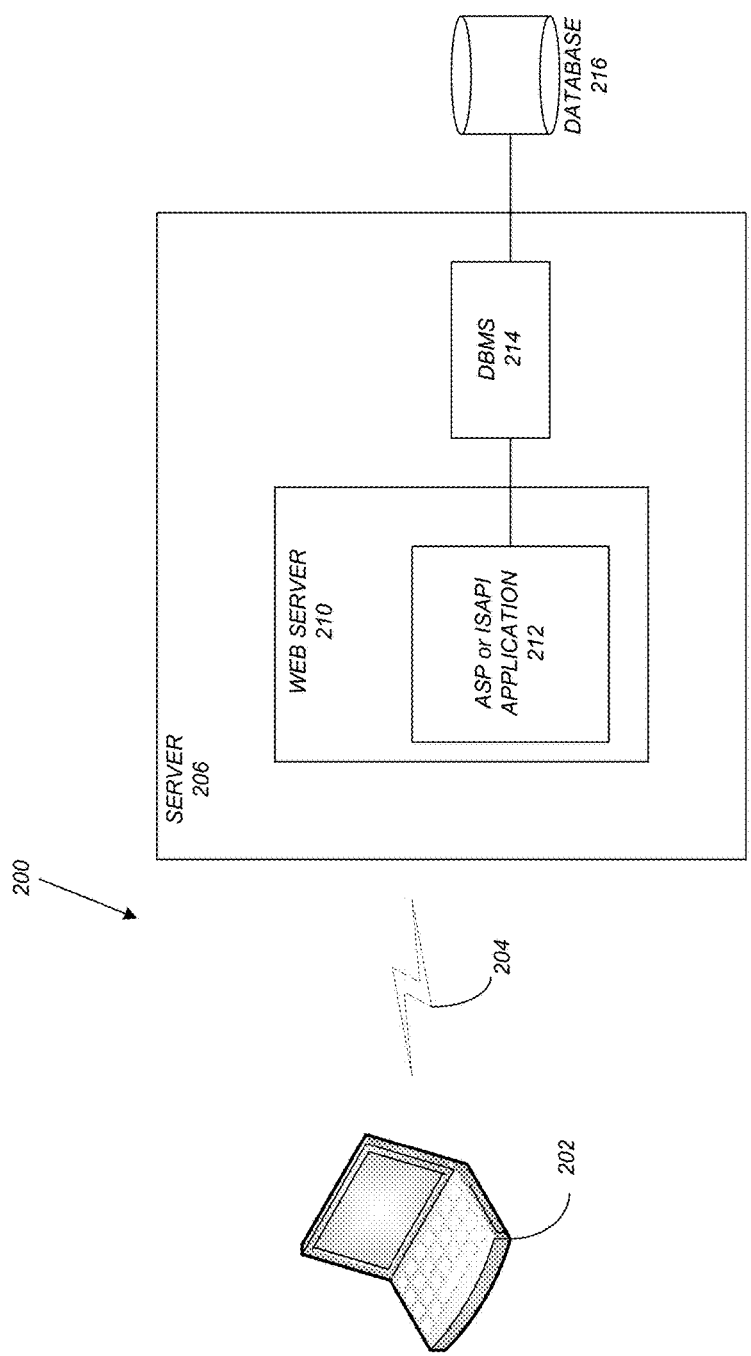
FIG. 2 schematically illustrates a typical distributed/cloud-based computer system using a network to connect client computers to server computers in accordance with one or more embodiments of the invention.

FIG. 2 schematically illustrates a typical distributed/cloud-based computer system 200 using a network 204 to connect client computers 202 to server computers 206. A typical combination of resources may include a network 204 comprising the Internet, LANs (local area networks), WANs (wide area networks), SNA (systems network architecture) networks, or the like, clients 202 that are personal computers or workstations (as set forth in FIG. 1), and servers 206 that are personal computers, workstations, minicomputers, or mainframes (as set forth in FIG. 1). However, it may be noted that different networks such as a cellular network (e.g., GSM [global system for mobile communications] or otherwise), a satellite based network, or any other type of network may be used to connect clients 202 and servers 206 in accordance with embodiments of the invention.

A network 204 such as the Internet connects clients 202 to server computers 206. Network 204 may utilize ethernet, coaxial cable, wireless communications, radio frequency (RF), etc. to connect and provide the communication between clients 202 and servers 206. Further, in a cloud-based computing system, resources (e.g., storage, processors, applications, memory, infrastructure, etc.) in clients 202 and server computers 206 may be shared by clients 202, server computers 206, and users across one or more networks. Resources may be shared by multiple users and can be dynamically reallocated per demand. In this regard, cloud computing may be referred to as a model for enabling access to a shared pool of configurable computing resources.

Clients 202 may execute a client application or web browser and communicate with server computers 206 executing web servers 210. Such a web browser is typically a program such as MICROSOFT INTERNET EXPLORER, MOZILLA FIREFOX, OPERA, APPLE SAFARI, GOOGLE CHROME, etc. Further, the software executing on clients 202 may be downloaded from server computer 206 to client computers 202 and installed as a plug-in or ACTIVEX control of a web browser. Accordingly, clients 202 may utilize ACTIVEX components/component object model (COM) or distributed COM (DCOM) components to provide a user interface on a display of client 202. The web server 210 is typically a program such as MICROSOFT'S INTERNET INFORMATION SERVER.

Web server 210 may host an Active Server Page (ASP) or Internet Server Application Programming Interface (ISAPI) application 212, which may be executing scripts. The scripts invoke objects that execute business logic (referred to as business objects). The business objects then manipulate data in database 216 through a database management system (DBMS) 214. Alternatively, database 216 may be part of, or connected directly to, client 202 instead of communicating/obtaining the information from database 216 across network 204. When a developer encapsulates the business functionality into objects, the system may be referred to as a component object model (COM) system. Accordingly, the scripts executing on web server 210 (and/or application 212) invoke COM objects that implement the business logic. Further, server 206 may utilize MICROSOFT'S TRANSACTION SERVER (MTS) to access required data stored in database 216 via an interface such as ADO (Active Data Objects), OLE DB (Object Linking and Embedding DataBase), or ODBC (Open DataBase Connectivity).

Generally, these components 200-216 all comprise logic and/or data that is embodied in/or retrievable from device, medium, signal, or carrier, e.g., a data storage device, a data communications device, a remote computer or device coupled to the computer via a network or via another data communications device, etc. Moreover, this logic and/or data, when read, executed, and/or interpreted, results in the steps necessary to implement and/or use the present invention being performed.

Although the terms "user computer", "client computer", and/or "server computer" are referred to herein, it is understood that such computers 202 and 206 may be interchangeable and may further include thin client devices with limited or full processing capabilities, portable devices such as cell phones, notebook computers, pocket computers, multi-touch devices, and/or any other devices with suitable processing, communication, and input/output capability.

Of course, those skilled in the art will recognize that any combination of the above components, or any number of different components, peripherals, and other devices, may be used with computers 202 and 206.

Software Embodiments

Embodiments of the invention are implemented as a software application on a client 202, server computer 206, or in a cloud-based computing system. Further, as described above, the client 202 or server computer 206 may comprise a thin client device or a portable device that has a multi-touch-based display.

Users may define and utilize "Playback Profiles" for simulating construction schedules with 3D models. As used herein, a "Playback Profile" is a packaged set of selected schedule activities and properties that control how such selected activities are highlighted during a simulation. Further details regarding Playback Profiles may be understood from the description below.

Playback Profiles let the user easily select key schedule elements (e.g., critical path activities) and highlight the model objects that are attached to those activities, so that they stand out during schedule simulation. Specifically, a Playback Profile provides the following three functions:

(1) The first function is easy selection of desired schedule activities, using activity properties. For example, critical path activities can be selected by choosing any activity that has a Total Float of 0.

(2) The second function is the control of the appearance of the model objects attached to the selected activities. This control can be exerted at any of three stages: before the object is built, while it is being built, and after it is built. Moreover, the control can be static (a single assigned color/transparency) or dynamic (color/transparency that changes over time). For example, an object might start out opaque red after being built, and then gradually fade to a transparent gray.

(3) The third function is control of the appearance of model objects attached to other (nonselected) activities. Put together, these three functions provide a schedule playback in which model objects belonging to the desired activities are specially highlighted, so that they stand out from the other model objects.

For example, a user interested in tracking the construction of the model objects belonging to critical path activities need only select the "Critical Path Playback Profile." When the schedule is played back, the model objects belonging to critical path activities turn red while they are being built, and then turn a light green after they are built. Afterwards, they gradually fade out to a light (ghosted) gray. Model objects belonging to other activities are left as a light gray.

In addition, the user will be able to create and edit his/her own Playback Profiles. In other words, s/he will be able to select a set of schedule activities, and will be able to specify the appearance (static or dynamic) of the associated model objects—before, during, and after they are "built". For example, a user might be interested in near-critical activities. S/he will be able to select those activities and will then be able to assign a pre-build appearance, a build appearance, and a post-build appearance. During simulation, only model objects belonging to near-critical schedule activities will be so highlighted.

In view of the above, embodiments of the invention, solve the problems of the prior art by providing the user an easy way to select desired schedule activities, to control how they are highlighted during simulation, and to easily package those profiles for future use with any model.

To better understand the invention, descriptions of the various graphical user interfaces (GUIs) as well as the settings available in such GUIs may be useful.

Figure 3:
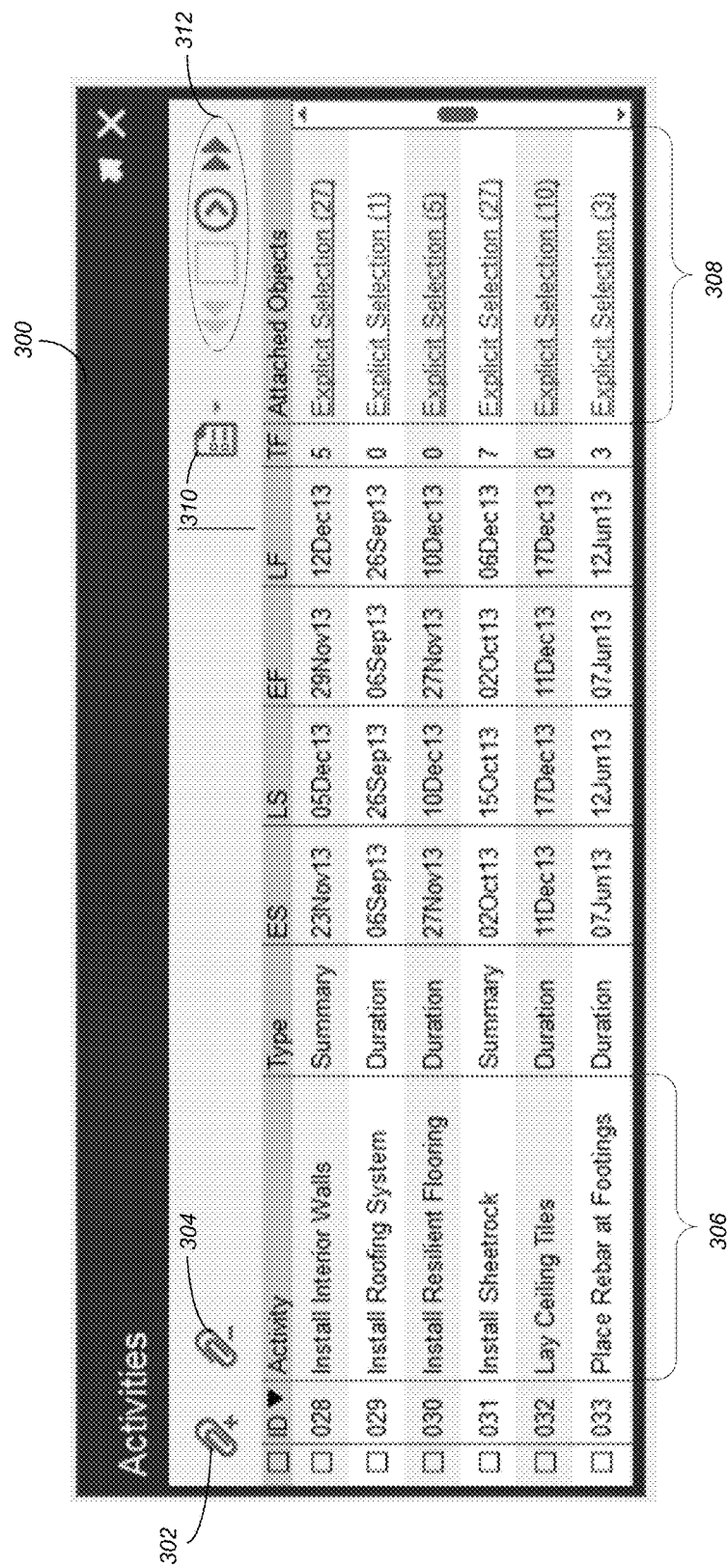
FIG. 3 illustrates the activities palette toolbar utilized in accordance with one or more embodiments of the invention.

FIG. 3 illustrates the activities palette toolbar utilized in accordance with one or more embodiments of the invention. Selection of button 302 associates selected model objects with an activity. Similarly, selection of button 304 de-associates model objects from an activity. In this regard, the list of activities are displayed in column 306 and the objects attached to each activity are displayed in column 308. The playback profiles drop-down menu 310 contains settings for activity filtering, model coloring, and playback options.

Generally speaking, whatever is displayed in the activities palette 300 is what gets shown during playback. However, each playback profile has settings that can alter that behavior.

Playback controls 312 allow the user to run the simulation. The buttons from left to right are (1) step back, (2) stop, (3) play/pause, and (4) step forward. Step back and step forward move the user backward or forward 1 day. Pause pauses the simulation. Stop completely stops the simulation and returns the model to its original colors and resets the timeline. In addition to the activities palette toolbar, a timeline may be displayed (i.e., within the scheduling/simulator) that allows the user to advance to a particular time/date in a simulation. The user may also specify/define the total playback duration time (e.g., via a settings menu of the timeline).

Using button 310, the user may view the list of playback profiles that are available with a current profile highlighted/checked. Available playback profiles may include standard, critical path, and summary activity. The standard profile may provide for a standard playback.

Figure 4:
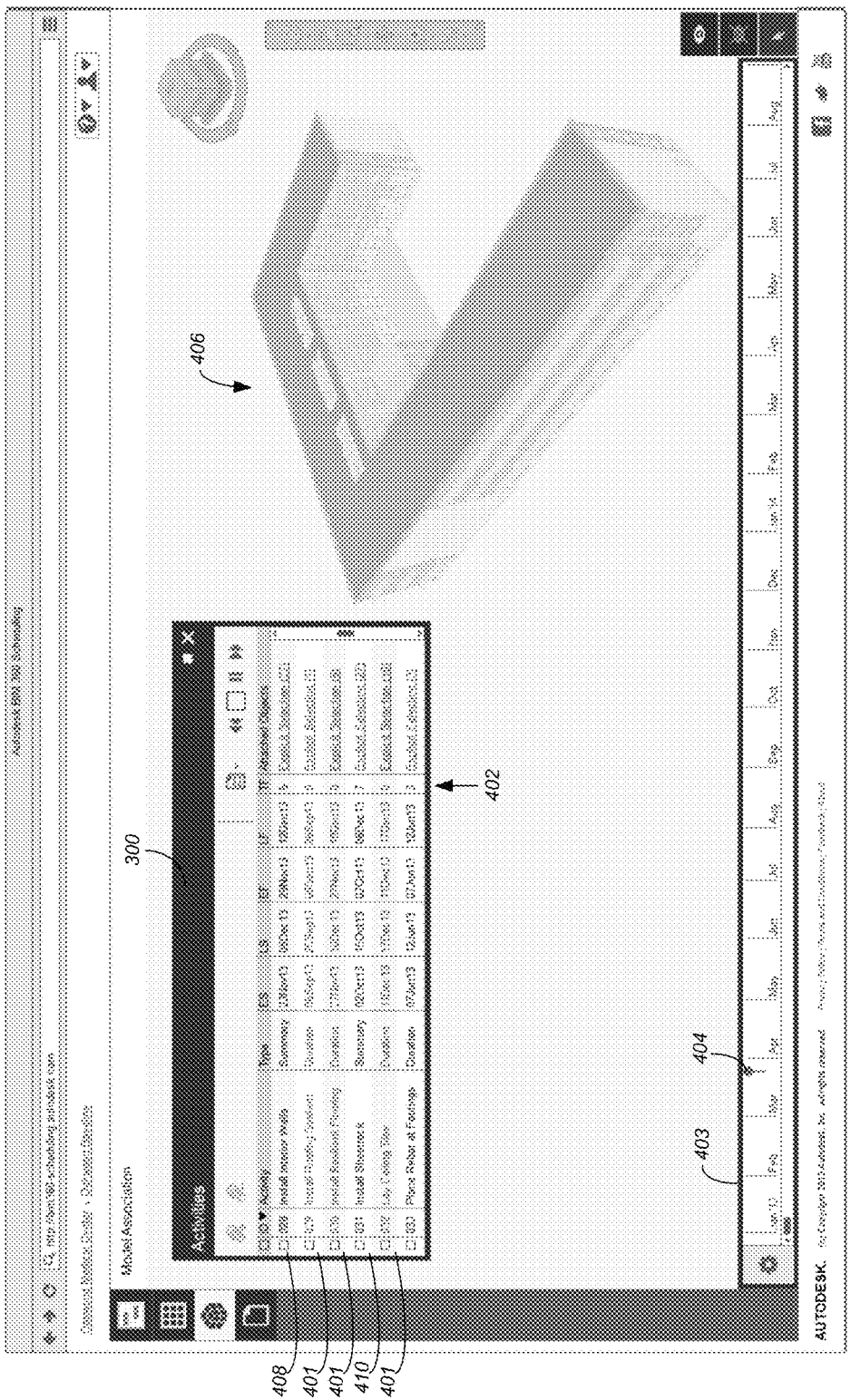
FIG. 4 illustrates a graphical user interface where a simulation playback has been commenced in accordance with one or more embodiments of the invention.

FIG. 4 illustrates a graphical user interface where a simulation playback has been commenced in accordance with one or more embodiments of the invention. In FIG. 4, the critical path playback profile has been selected resulting in various activities that are highlighted in panel 300. For example, certain rows 401 that represent critical path activities may be displayed in a different color font (e.g., red). In this regard, the total float 402 (e.g., the number of days in which the timing of the activity may vary) may indicate whether an activity is part of a critical path or otherwise. For example, if the total float 402 has a value of "0", such an activity may have a critical path.

To trigger the playback illustrated in FIG. 4, the user has selected the play button in FIG. 3. Thereafter, the simulation advances through the timeline 403. The current time/date within timeline 403 is indicated by timeline control 404. The user can click anywhere in timeline 403 to move the simulation's current date. As the simulation plays, different portions of the model 406 may be highlighted depending on the settings for the playback profile selected. For example, the roof of the model 406 may be highlighted in red or colored differently than remaining objects.

The user can pause the simulation at any time (e.g., using the play/pause button). When paused, the model 406 may retain its simulation colors and transparencies and the timeline 403 may not reset. In contrast, when the user selects the stop button, the simulation stops and resets the time to T=0, returning the model to its original colors.

If the user has selected the "Summary Activity" playback profile, all but summary activities are hidden. Playback will show the cumulative build for each summary activity, thus letting the user see what has been built at important milestones. Summary activities (e.g., rows 408 and 410) may be displayed in a contrasting color (e.g., green) (e.g., not hidden) when the summary activity playback profile is selected.

Figure 5:
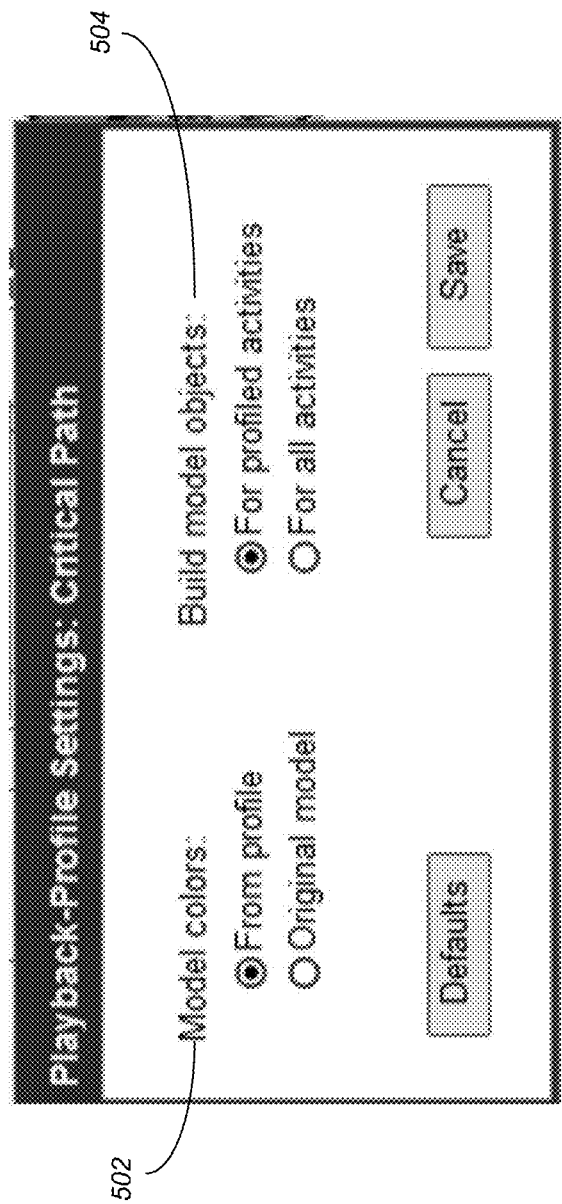
FIG. 5 illustrates the playback profile settings dialog in accordance with one or more embodiments of the invention.

FIG. 5 illustrates the playback profile settings dialog in accordance with one or more embodiments of the invention. Such a dialog may be displayed if/when the user opts to edit playback profile settings. The model colors options 502 control whether the playback profile's model colors are used (e.g., red for critical path activities) or whether the original model colors are used. The build model objects options 504 control whether all activities are built out, or only the ones highlighted in the activities palette 300.

Logical Flow

Figure 6:
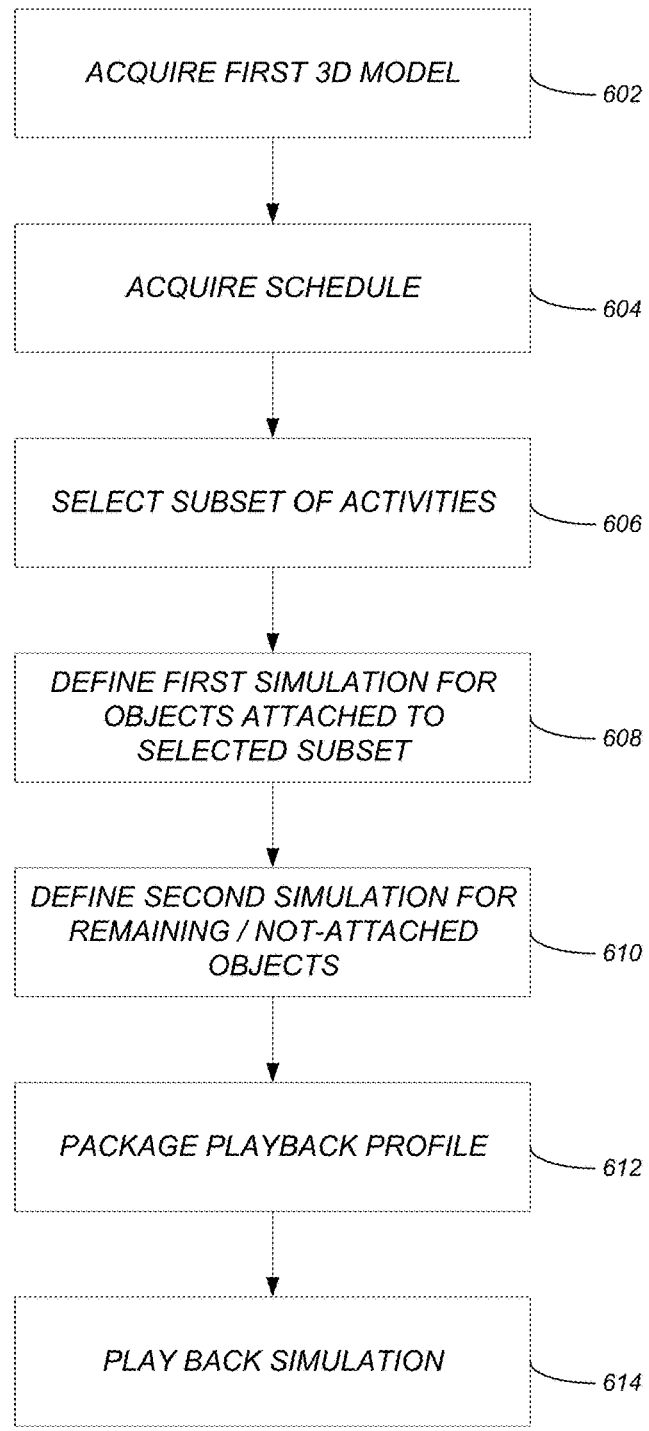
FIG. 6 illustrates the logical flow for defining and using a playback profile (i.e., to simulate a construction schedule) in accordance with one or more embodiments of the invention.

FIG. 6 illustrates the logical flow for defining and using a playback profile (i.e., to simulate a construction schedule) in accordance with one or more embodiments of the invention.

At step 602, a first 3D model is acquired.

At step 604, a (construction) schedule is acquired. The schedule includes one or more activities for building the 3D model. Each of the activities is associated with one or more model objects of the 3D model. The schedule can be created by the user or can be imported from any scheduling software (e.g., MICROSOFT PROJECT, ASTA, and PRIMAVERA).

At step 606, a subset of the one or more activities is selected based on one or more properties of the one or more activities. The activities that are selected may be based on a variety of different properties/attributes/filters (e.g., from the model or the schedule). Exemplary properties/attributes/filters may include an activity code, a responsible party/user, a level, a zone, a floor, a phase of a building, etc. Further, a combination of such properties/attributes/filters may be used.

At step 608, a first simulation appearance (of the model objects attached to the selected subset of activities) is defined. The first simulation appearance may be a single static appearance of a color or transparency. Alternatively, the first simulation appearance may be a dynamic appearance of a color or transparency that changes over time. For example, the first simulation appearance may be defined for one or more of: before the model objects are built, while the model objects are built, and after the model objects are built. In a more specific example, the one or more model objects may begin at a first transparency value and color after being built, and gradually fade to a second transparency value and color.

At step 610, a second simulation appearance (of the model objects attached to the activities that were not selected) is defined.

At step 612, the selected subset, the first simulation appearance, and the second simulation appearance are packaged into a playback profile that is capable of being applied to a second 3D model. The packaging may include the storage of the profile in a variety of formats (e.g., extensible markup language [XML], a database, comma separated value [CSV]) in a variety of locations (e.g., in the cloud, on a client computer, on a server, on multiple servers, etc.). Further, access to the playback profiles may be available by distributing the file, via a uniform resource locator (URL) link, via download from a service/website, etc.

At step 614, a simulation (based on the playback profile) of construction of the first 3D model is played back. Of note is that each time the simulation is performed, the resulting display may be different based on updated property values for the properties of the activities or updated object values of the model objects. In other words, as the model is updated or construction is actually performed, the values associated with the model may be different thereby resulting in a changed simulation. For example, if certain activities fall behind schedule, the simulation may reflect such timing and can be used to view the effect on remaining construction.

A predefined set of playback profiles may be available for selection. For example, a critical path playback profile may provide for the highlighting of objects (in a particular manner) where such objects are attached to activities having a total float property value of zero (0). Such a critical path playback profile may include a first simulation appearance that displays the model objects attached to the selected subset of the activities: in a first color while being built; in a second color after being built; and fading to a third color from the second color.

Another playback profile that may be available for selection is a near critical path playback profile. For such a playback profile, the subset of activities that are selected are based on a property having a total float between zero and a threshold value.

Different playback profiles may enable different simulations. For example, the properties that may be used in a simulation may consist of a number of people used to build the one or more attached model objects. In such a playback profile, the first simulation appearance may define/appear as a heat map based on the number of people/construction workers used to build that particular object.

Steps 612-614 may also include the ability to acquire a second 3D model in which the playback profile is used to conduct/play back a construction simulation. In other words, a packaged playback profile may be applied and used to simulate construction of a variety of different 3D models. Further, different users may use different profiles to simulate construction of the same model (based on the different settings/configurations in the respective playback profiles). For example, a first playback profile may be distributed to a first user, and a second playback profile may be distributed to a second user. Thereafter, in addition to simulating construction using the first playback profile, the second user may apply the second playback profile to the first 3D model to playback a different simulation of the first 3D model.

CONCLUSION

This concludes the description of the preferred embodiment of the invention. The following describes some alternative embodiments for accomplishing the present invention. For example, any type of computer, such as a mainframe, minicomputer, or personal computer, or computer configuration, such as a timesharing mainframe, local area network, or standalone personal computer, could be used with the present invention.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A computer-implemented method for simulating a construction schedule, comprising:
  acquiring a schedule, wherein the schedule comprises one or more activities for a construction process, wherein the construction process comprises building one or more three-dimensional (3D) models, wherein each of the one or more 3D models comprise one or more model objects;
  selecting a subset of the one or more activities based on one or more properties of the one or more activities;
  defining a first simulation appearance for one or more model objects of the 3D model that will be attached to the selected subset of the one or more activities;
  defining a second simulation appearance for one or more model objects of the 3D model that will be attached to the one or more activities that were not selected;
  packaging the selected subset, the first simulation appearance, and the second simulation appearance into a playback profile, wherein the playback profile controls how one or more model objects attached to the selected subset of activities are highlighted during a future simulating of the construction process of any of the one or more 3D models;
  acquiring a first 3D model and a second 3D model, wherein the first 3D model and the second 3D model are different 3D models;
  determining one or more objects in the first 3D model that are attached to the selected subset of the one or more activities;
  playing back a first simulation of construction of the first 3D model based on the playback profile, wherein an appearance of the determined one or more model objects of the first 3D model is controlled by the first simulation appearance and the second simulation appearance in the playback profile, wherein the first simulation appearance provides that the determined one or more model objects in the first 3D model that are attached to the selected subset of the one or more activities are highlighted so that they stand out from the determined one or more objects that are attached to the one or more activities that were not selected;
  determining one or more objects in the second 3D model that are attached to the selected subset of the one or more activities; and playing back a second simulation of construction of the second 3D model based on the playback profile, wherein an appearance of the determined one or more model objects of the second 3D model is controlled by the first simulation appearance and the second simulation appearance in the playback profile, wherein the first simulation appearance provides that the determined one or more model objects in the second 3D model that are attached to the selected subset of the one or more activities are highlighted so that they stand out from the determined one or more objects that are attached to the one or more activities that were not selected.

2. The computer-implemented method of claim 1, wherein the defining the first simulation appearance is defined for one or more of before the one or more model objects are built, while the one or more model objects are built, and after the one or more model objects are built.

3. The computer-implemented method of claim 1, wherein the defining the first simulation appearance comprises a single static appearance of a color or transparency.

4. The computer-implemented method of claim 1, wherein the defining the first simulation appearance comprises a dynamic appearance of a color or transparency that changes over time.

5. The computer-implemented method of claim 4, wherein the one or more model objects begin at a first transparency value and color after being built, and fade to a second transparency value and color.

6. The computer-implemented method of claim 1, wherein:
the playback profile comprises a critical path playback profile;
the subset of the one or more activities that are selected are based on a property having zero (0) total float;
the first simulation appearance comprises displaying the one or more model object attached to the selected subset of the one or more activities:
in a first color while being built;
in a second color after being built; and
fading to a third color from the second color.

7. The computer-implemented method of claim 1, wherein:
the playback profile comprises a near critical path playback profile; and
the subset of the one or more activities that are selected are based on a property having a total float between zero and a threshold value.

8. The computer-implemented method of claim 1, wherein:
the one or more properties of the one or more activities comprise a number of people used to build the one or more model objects; and
the first simulation appearance defines a heat map based on the number of people.

9. The computer-implemented method of claim 1, further comprising:
distributing the playback profile to a first user;
distributing a second playback profile to a second user;
applying the second playback profile to the first 3D model to playback a different simulation of the first 3D model based on the second playback profile.

10. The computer-implemented method of claim 1, wherein the simulation changes based on updated property values for the one or more properties of the one or more activities or updated object values of the one or more model objects.

11. An apparatus for simulating a construction schedule in a computer system comprising:
(a) a computer having a memory;
(b) an application executing on the computer, wherein the application is configured to:
(1) acquire a schedule, wherein the schedule comprises one or more activities for a construction process, wherein the construction process comprises building one or more three-dimensional (3D) models, wherein each of the one or more 3D models comprises one or more model objects;
(2) select a subset of the one or more activities based on one or more properties of the one or more activities;
(3) define a first simulation appearance for one or more model objects of the 3D model that will be attached to the selected subset of the one or more activities;
(4) define a second simulation appearance for one or more model objects of the 3D model that will be attached to the one or more activities that were not selected;
(5) package the selected subset, the first simulation appearance, and the second simulation appearance into a playback profile, wherein the playback profile controls how the one or more model objects attached to the selected subset are highlighted during a future simulating of the construction process of any of the one or more 3D models;
(6) acquire a first 3D model and a second 3D model, wherein the first 3D model and the second 3D model are different 3D models;
(7) determine one or more objects in the first 3D model that are attached to the selected subset of the one or more activities;
(8) play back a first simulation of construction of the first 3D model based on the playback profile, wherein an appearance of the determined one or more model objects of the first 3D model is controlled by the first simulation appearance and the second simulation appearance in the playback profile, wherein the first simulation appearance provides that the determined one or more model objects in the first 3D model that are attached to the selected subset of the one or more activities are highlighted so that they stand out from the determined one or more objects that are attached to the one or more activities that were not selected;
(9) determine one or more objects in the second 3D model that are attached to the selected subset of the one or more activities; and
(10) play back a second simulation of construction of the second 3D model based on the playback profile, wherein an appearance of the determined one or more model objects of the second 3D model is controlled by the first simulation appearance and the second simulation appearance in the playback profile, wherein the first simulation appearance provides that the determined one or more model objects in the second 3D model that are attached to the selected subset of the one or more activities are highlighted so that they stand out from the determined one or more objects that are attached to the one or more activities that were not selected.

12. The apparatus of claim 11, wherein the first simulation appearance is defined for one or more of before the one or more model objects are built, while the one or more model objects are built, and after the one or more model objects are built.

13. The apparatus of claim 11, wherein the first simulation appearance comprises a single static appearance of a color or transparency.

14. The apparatus of claim 11, wherein the first simulation appearance comprises a dynamic appearance of a color or transparency that changes over time.

15. The apparatus of claim 14, wherein the one or more model objects begin at a first transparency value and color after being built, and fade to a second transparency value and color.

16. The apparatus of claim 11, wherein:
the playback profile comprises a critical path playback profile;
the subset of the one or more activities that are selected are based on a property having zero (0) total float;
the first simulation appearance comprises displaying the one or more model object attached to the selected subset of the one or more activities:
in a first color while being built;
in a second color after being built; and
fading to a third color from the second color.

17. The apparatus of claim 11, wherein:
the playback profile comprises a near critical path playback profile; and
the subset of the one or more activities that are selected are based on a property having a total float between zero and a threshold value.

18. The apparatus of claim 11, wherein:
the one or more properties of the one or more activities comprise a number of people used to build the one or more model objects; and
the first simulation appearance defines a heat map based on the number of people.

19. The apparatus of claim 11, wherein the application is further configured to:
distribute the playback profile to a first user;
distribute a second playback profile to a second user;
apply the second playback profile to the first 3D model to playback a different simulation of the first 3D model based on the second playback profile.

20. The apparatus of claim 11, wherein the simulation changes based on updated property values for the one or more properties of the one or more activities or updated object values of the one or more model objects.

* * * * *